(12) United States Patent
Bharj (10) Patent No.: US 7,057,464 B2
(45) Date of Patent: Jun. 6, 2006

(54) LINEARISER

(75) Inventor: Jaspal Bharj, Eastcote (GB)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/399,941

(22) PCT Filed: Nov. 23, 2001

(86) PCT No.: PCT/GB01/05180

§ 371 (c)(1),
(2), (4) Date: Jul. 18, 2003

(87) PCT Pub. No.: WO02/43241

PCT Pub. Date: May 30, 2002

(65) Prior Publication Data

US 2004/0012444 A1    Jan. 22, 2004

(51) Int. Cl.
*H03F 3/04* (2006.01)
(52) U.S. Cl. .................... 330/302; 330/305
(58) Field of Classification Search ............. 330/302, 330/296, 285, 294, 305, 149; 333/32
See application file for complete search history.

(56) References Cited

U.S. PATENT DOCUMENTS

| 5,276,406 A | * | 1/1994 | Samay et al. | 330/277 |
| 5,982,236 A | * | 11/1999 | Ishikawa et al. | 330/296 |
| 6,441,689 B1 | * | 8/2002 | Joseph | 330/302 |

FOREIGN PATENT DOCUMENTS

| JP | 5-315865 | * 11/1993 | 330/302 |

* cited by examiner

*Primary Examiner*—Henry Choe
(74) *Attorney, Agent, or Firm*—Lackenbach Siegel LLP

(57) ABSTRACT

The present invention relates to a lineariser for use with an amplifier. The lineariser comprises an input means and an output means. Input matching means are provided to receive an input signal. A transistor is provided, said transistor being arranged to operate substantially close to a switched on condition. The transistor is arranged to apply a non-linear gain to said input signal. The output means output the non-linear gain signal to said amplifier. The lineariser may be used with a RF power amplifier. The lineariser may be used in elements of a communication system.

22 Claims, 6 Drawing Sheets

LINEARISER

FIELD OF INVENTION

The present invention relates to a lineariser and in particular but not exclusively to a lineariser for use with a power amplifier. The lineariser may be used in elements of a communication system.

BACKGROUND OF THE INVENTION

An area covered by a cellular telecommunications network is divided into a plurality of cells. Each of these cells has a base station arranged to transmit signals to and receive signals from mobile stations located in the cell associated with the respective base station. Mobile stations will be in active communication with the base station associated with the cell in which the mobile station is located.

A modulation system has been developed for use within a cellular network using the Global System for Mobile communication (GSM) standard which enhances the rate at which data is transferred between the mobile stations and the base stations. This modulation scheme is called Enhanced Data rate for GSM Evolution or EDGE modulation. EDGE modulation is a known modulation scheme so will not be explained in detail hereinafter. It is sufficient to note that EDGE modulation modulates digital data using both phase and amplitude information. To reduce errors at the receiver, the transmitted signal is substantially similar to the modulated signal. Therefore the phase and amplitude errors introduced between the EDGE modulator and the transmitting antenna should be kept to a minimum. Power amplifier circuitry may introduce such phase and amplitude errors.

Figure 2:
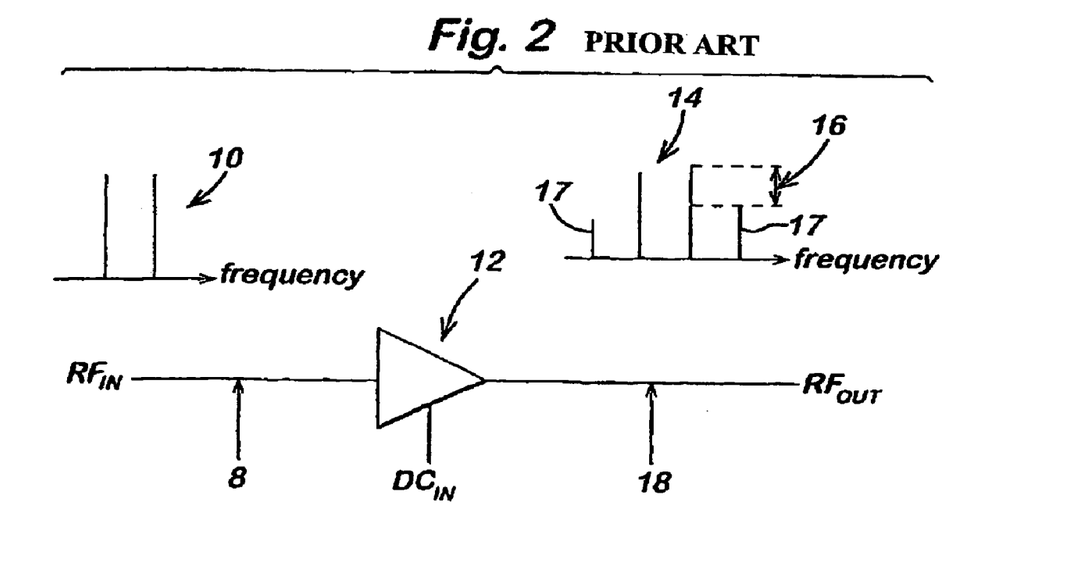
FIG. 2 shows a known power amplifier.

FIG. 2 shows a conventional power amplifier 12. The power amplifier 12 may have at its input 8 a modulated radio signal 10. The input radio signal 10 may be a modulated digital signal. The power amplifier 12, when operated beyond saturation produces intermodulation distortion products 17 at its output 18 as well as the desired carrier signals 14. The intermodulation distortion products 17 are produced on either side of the desired carrier signals 14. Intermodulation distortion products 17 are caused by the power amplifier 12 not acting as a linear amplifier, which occurs when the power amplifier is operated beyond saturation.

The intermodulation distortion produces frequencies at multiples of the carrier frequency of the desired signals. These frequencies 17 tend to be lower in signal strength than the desired carriers by an amount which is referenced 16 in FIG. 2. These intermodulation distortion products 17 increase the spectral space occupied and are therefore undesirable.

One way to reduce the intermodulation distortion products, is to operate the power amplifiers as linear amplifiers. The power amplifiers would be operated so that there is a substantially linear relationship between the input signal power and the output signal power.

Figure 3A:
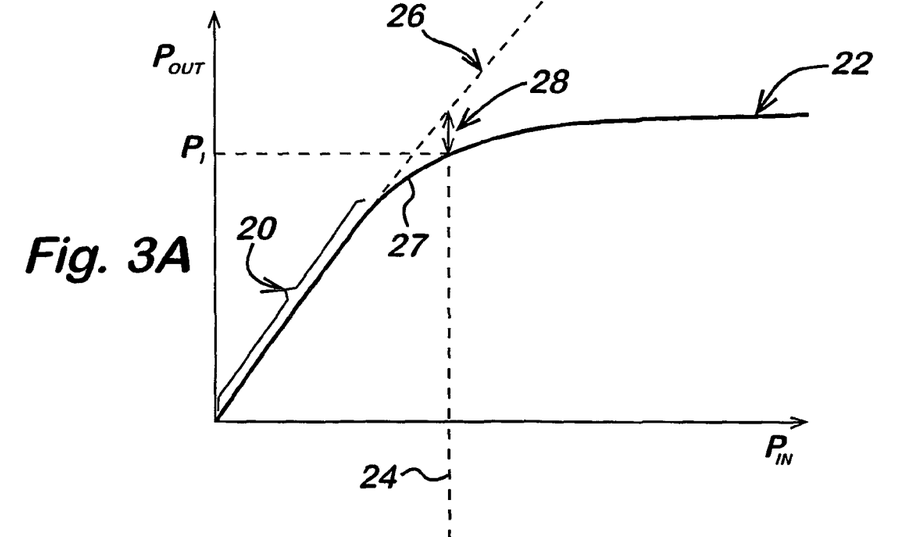
FIG. 3a shows the power characteristics of the power amplifier of FIG. 2.

FIG. 3a shows a graph of output signal power against input signal power for a typical power amplifier. The linear region 20 in which the power amplifier should be operated to reduce intermodulation distortion is not as efficient as if the power amplifier were operated at a point 24. Point 24 is called the P1 point and the amplifier operates non linearly beyond this point. The P1 point is a figure of merit and is defined as the point where there is 1 dB of compression 28 and is the point at which the power amplifier is most efficient. In other words, the P1 point of the power amplifier is the point where the actual output power of the power amplifier is 1 dB less than the expected output power of the power amplifier if it were operated linearly as indicated by the dashed line 26. The linear region 20 extends to a point 27 where the power amplifier begins to saturate. Saturation means that the power of the output signal is no longer linearly related to the power of the input signal. Once the power amplifier is operated in the saturation region, a large increase in input signal power provides a small increase in output signal power. This is shown in FIG. 3a by the line referenced 22.

Figure 3B:
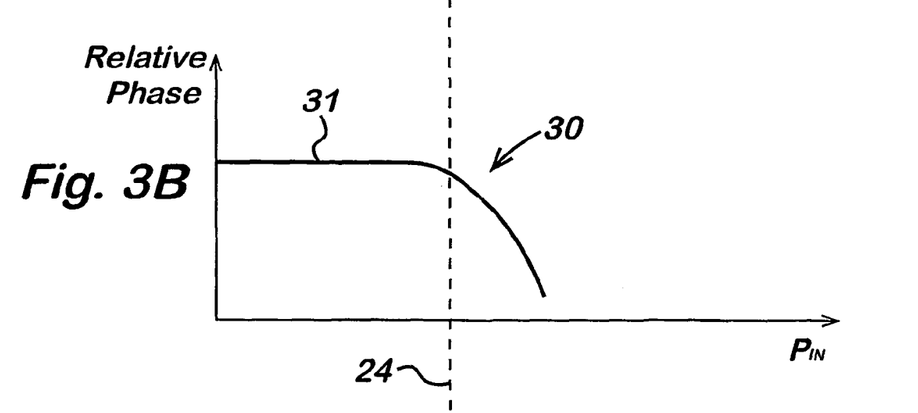
FIG. 3b shows the phase characteristics of the power amplifier of FIG. 2.

FIG. 3b shows the relative phase of an output signal of a power amplifier against input signal power. The phase of the output signal relative to the input signal is constant until point 31. The relative phase of the output signal decreases non linearly for an increasing input signal power beyond point 31. Point 31 may or may not correspond to point 27 of FIG. 3a.

As EDGE modulation requires accurate transmittal of both amplitude and phase information, it is important that the power amplifiers are operated in the linear region 20 meaning a reduction in power amplifier efficiency. A typical power amplifier will be "backed off" by around 6 dB. This means that the power amplifier is operated around 6 dB below the P1 point 24 to ensure that the power amplifier operates in the linear region 20.

Figure 3C:
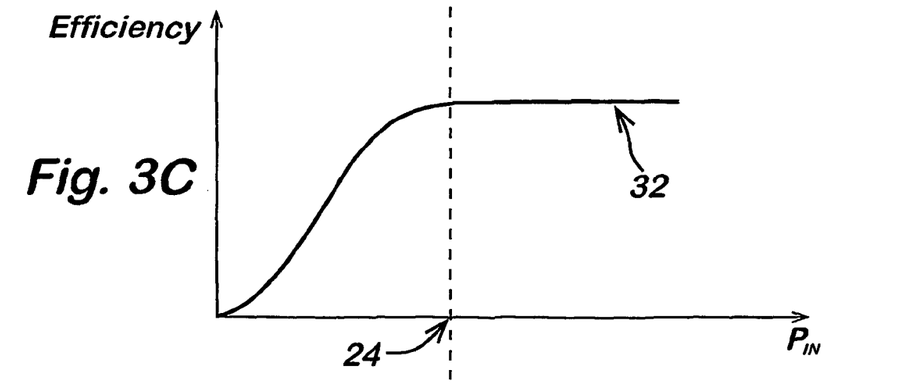
FIG. 3c shows the efficiency characteristics of the power amplifier of FIG. 2.

Reference is made to FIG. 3c which shows the efficiency of the power amplifier against the input signal power. As can be seen, the greatest efficiency is achieved when the power amplifier is operating non-linearly, in the region 32. If the power amplifier is operated in the linear region, more power is required to amplify a signal by a given value. The power amplifier consumes more power and the size and cost of the power amplifier is increased. Furthermore there will be increased heat dissipated by the power amplifier which may require extra cooling elements.

Figure 4A:
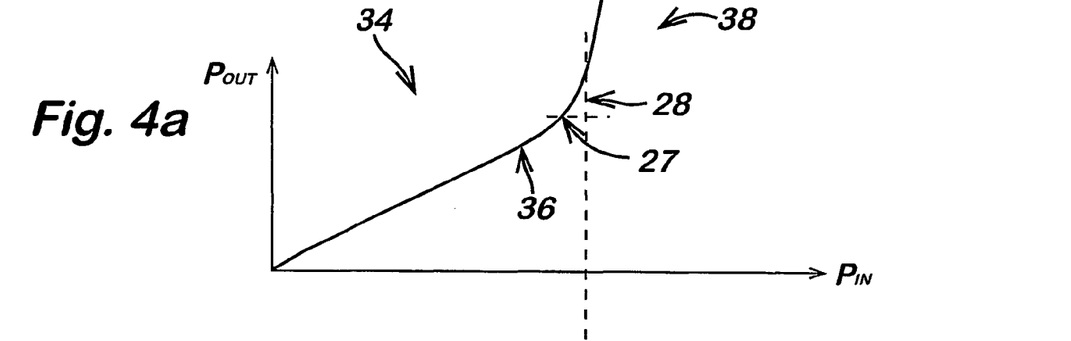
FIG. 4a shows the power characteristics of a known lineariser.

To allow operation of an amplifier with reduced intermodulation distortion at the P1 point, linearisers have been developed and are known in the art. A lineariser is placed before the power amplifier in the signal path and therefore preconditions the input signal before passing it to the power amplifier. A typical lineariser power characteristic 34 is shown in FIG. 4a. FIG. 4a shows output signal power against input signal power for a lineariser. As can be seen the lineariser has a linear power characteristic 36 up to the point 27 where the power characteristic begins to curve upwards. In other words the gain of the lineariser increases as the power of the input signal increases beyond point 27 and increases in such a way as to substantially oppose the typical power amplifier power characteristics. This is called gain expansion. A lineariser should be capable of producing about 5 dB of gain expansion to mitigate the non linear amplitude problems associated with power amplifiers beyond saturation as discussed previously. The effect of the lineariser is to increase the effective range over which the power amplifier is linear but allows the power amplifier to operate in its more efficient non-linear range.

Figure 4B:
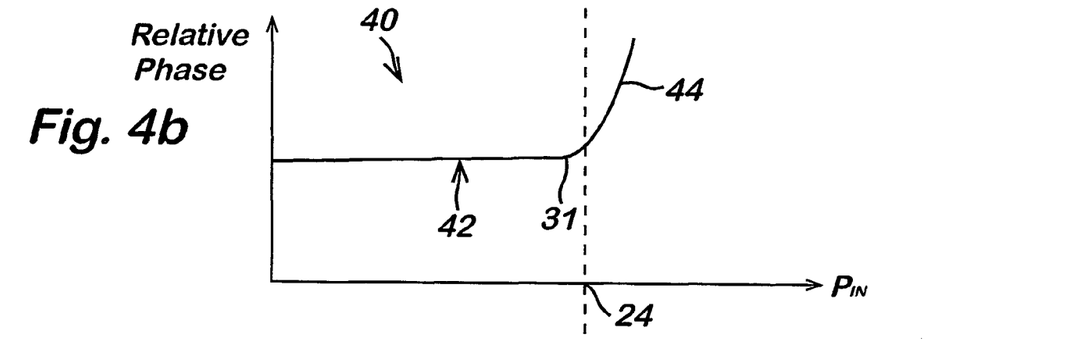
FIG. 4b shows the phase characteristics of a known lineariser.

FIG. 4b shows the relative phase characteristics 40 of a typical lineariser against input signal power. When the lineariser is operated with an input signal power less than the input signal power corresponding to point 31, the relative phase characteristic of the lineariser is substantially flat. The output signal has a substantially similar phase to the input signal. After point 31 however the lineariser has an increasing relative phase characteristic 44. The increasing relative phase characteristic produced by the lineariser is non linear and is such that it substantially opposes the decreasing relative phase characteristics of the power amplifier. This means therefore that the output signal from a lineariser is a pre-conditioned signal so that when it is subsequently fed into a typical power amplifier, the described phase limitations on a power amplifier are reduced.

The known linearisers are made from substantially large, discreet components. The linearisers have a complex structure. The linearisers typically require temperature compensation. In addition, the lineariser components may need to be carefully aligned. This all makes the use of known linearisers difficult within small low power devices. This is especially true for integrated circuits and in particular for use within microwave monolithic integrated circuits (MMIC). MMICs are used within many modern circuits for example in satellite and mobile telephony technologies.

SUMMARY OF INVENTION

It is therefore the aim of the present invention to provide a lineariser which addresses one or more of the problems as discussed above.

There is provided according to the invention a lineariser arranged to provide an increase in gain for an increased signal level comprising: input matching means arranged to receive an input signal; a transistor arranged to operate substantially close to a switched on condition, said transistor being arranged to apply a non-linear gain to said input signal; and output for outputting the non-linear gain signal; and feedback means provided across said transistor comprising resistive circuitry.

BRIEF DESCRIPTION OF DRAWINGS

For better understanding of the present invention, reference will now be made by way of example to the accompanying drawings in which.

DETAILED DESCRIPTION OF EMBODIMENTS OF THE PRESENT INVENTION

Figure 1:
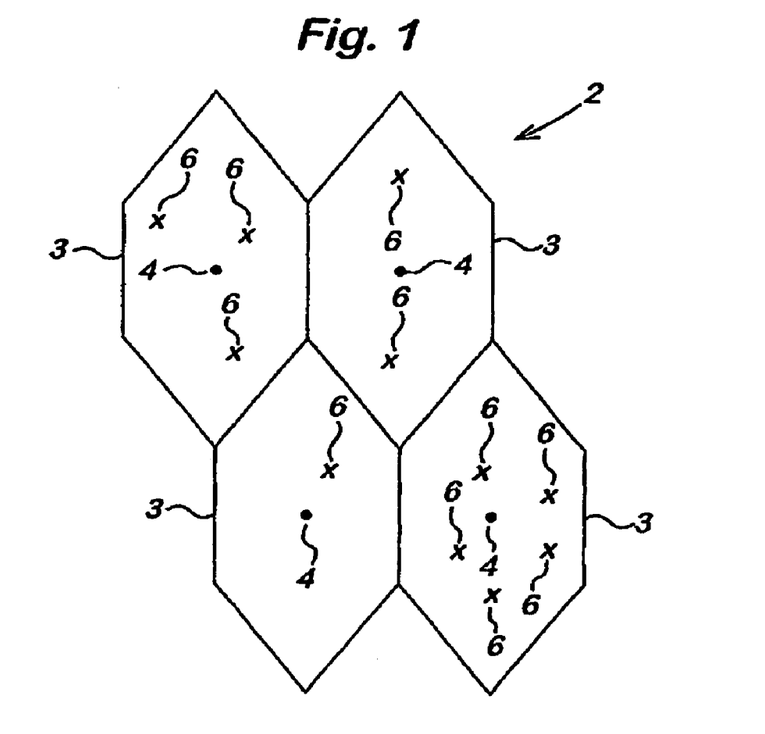
FIG. 1 shows a typical cell layout of a cellular network.

Reference is now made to FIG. 1 which shows part of a cellular telecommunications network 2 in which embodiments of the present invention can be implemented. The area covered by the network is divided into a plurality of cells 3, four of which are shown in FIG. 1. Each cell 3 has associated therewith a base station transceiver station 4. The base transceiver stations 4 are arranged to communicate with mobile terminals 6 located in the cell associated with a given base station.

Figure 5:
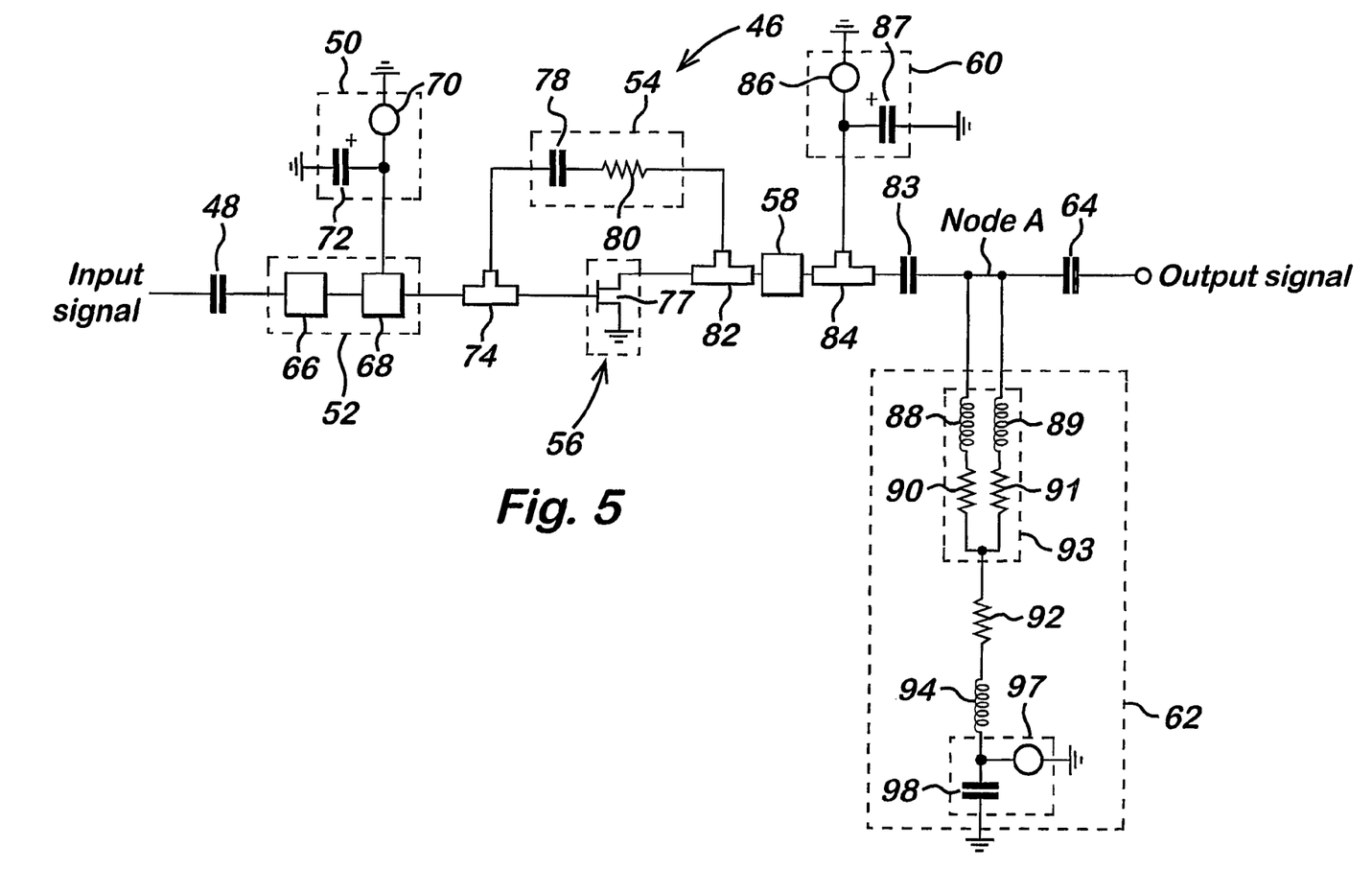
FIG. 5 shows a diagram of a lineariser embodying the present invention.

Reference is now made to FIG. 5 which shows a lineariser embodying the present invention. This lineariser may be incorporated into a mobile station or a base station. The input signal supplied by, in this case an EDGE modulator, is fed into an input decoupling capacitor 48. As the EDGE modulator is known, it will not be discussed in any more detail hereinafter. The input signal may be at a radio or intermediate frequency. The input decoupling capacitor means 48 substantially reduces any direct current (DC) component of the input signal being fed into the lineariser 46.

The output of the input decoupling capacitor means 48 is fed into the input matching circuit 52. The input matching circuit 52 serves to reduce return loss and increase the bandwidth to frequency ratio of the lineariser. Return loss quantifies the amount of incident signal power which is reflected. In other words, the higher the return loss the higher the proportion of reflected incident signal power. A low return loss assists the cascadability of the lineariser. This is because a smaller proportion of incident signal power is reflected so a greater proportion of incident signal power is utilised. Additionally the input matching circuit 52 serves to maximise the gain expansion of the lineariser.

The input matching circuit 52 comprises an input impedance 66 and an input connector 68. The output of the input decoupling capacitor 48 is fed into the input impedance 66. The input impedance 66, if matched, will allow the maximum amount of power to be transferred. This means that there is a lower return loss and therefore facilitates ease of cascadability. The output of the input impedance 66 is fed in series to a first input of the connector 68.

A second input to the connector 68 is connected to the output of a first DC biasing circuit 50. The first DC biasing circuit 50 supplies part of the DC biasing for a transistor arrangement 56 described hereinafter. More particularly, the circuit 50 may be used to control the performance, optimisation and alignment of the transistor arrangement 56. The first DC biasing apparatus 50 comprises a first DC voltage source 70 and a first bias decoupling capacitor 72. The first DC voltage source 70 has a first output connected to the first bias decoupling capacitor 72 and a second output connected to ground. The first DC voltage source 70 produces a DC voltage which can be varied between an upper and lower limit. The first bias decoupling capacitor 72 is connected between the first output of the voltage source 70 and ground. The decoupling capacitor 72 passes most time variant signals to ground. This means that the voltage presented to the input matching circuit 52 is substantially DC.

The output of the input matching circuit 52 is presented to a first terminal of a first Tee shaped connector 74. Connected to a second terminal of the first Tee shaped connector 74 is the output of a feedback circuit 54 and connected to a third terminal output of the first Tee shaped connector is the transistor arrangement 56.

The feedback circuit 54 comprises a feedback capacitor 78 connected in series with a feedback resistor 80. The feedback capacitor 78 and feedback resistor 80 in combination increase the bandwidth of the lineariser and also smooth the output characteristics of the described lineariser 46. Stability of the system is increased because the feedback makes the system more adaptive. The feedback circuit 54 takes some of the power out of the system and feeds it back at coupler 74 before a transistor arrangement 56. Thus it may reduce the total gain but the loss in the total gain is compensated by the increase in the bandwidth and by the more stable operation. The feedback circuit 52 is stable so the likelihood of the stability of the external amplifier means, to which the lineariser is attached, from being affected is reduced.

The transistor arrangement 56 comprises a metal-semiconductor field effect transistor (MESFET) 77. The gate of the MESFET 77 is connected to the third terminal of the first Tee shaped connector 74. The transistor arrangement 56 may comprise any other form, arrangement or number of constituent transistors, and the MESFET described is only by way of example. The MESFET 77 is operated close to the pinch-off region so that the gain expansion characteristics of the MESFET 77 in this region can be utilised. The pinch-off region of the MESFET 77 is the region where the MESFET 77 is just switched on and is a voltage controlled region.

The MESFET can be thought of as a non-linear voltage controlled current source, which above pinch-off, is described by an arbitrary power law, and below pinch-off, is switched off. The transition between the two is a soft transition. For a typical MESFET, this power law will be about 1.7.

When a large signal is applied to a MESFET biased just above pinch-off (i.e. Class AB), there is a tendency for the negative peaks to be severely clipped, and positive peaks follow the power law. In the case of the MESFET with the 1.7 power law, it is possible for the gain to rise, compared to the relatively low small signal gain of the nearly pinched-off operating point.

For the MESFET, the magnitude of the peak output voltage, $V_{out}(pk)$, during clipping is non-linearly related to the input drive level, $V_{in}(pk)$. When $V_{GS}=V_{TO}$, the peak voltage is approximately given by:

$$V_{out(pk)} \approx -R_L \beta V_{in(pk)}^Q \quad (1)$$

Where $A_V$ is the voltage gain, $R_L$ is the load resistance, Q is the power law of the MESFET and $\beta$ is a scaling parameter relating to FET width.

Thus the magnitude of the voltage gain $A_V$ of the circuit under clipping is given by equation (2):

$$|A_v| \approx 0.5 \left| \frac{V_{out(pk)}}{V_{in(pk)}} \right| \approx R_L \beta V_{in(pk)}^{Q-1} \quad (2)$$

It can be seen that when Vin is small, the gain tends to 0 (i.e. the small signal gain for Class AB operation). However, as $V_{in}$ increases, the gain $A_V$ will also increase for Q>1 with a Q-1 power law. For a typical MESFET this increase will be a 0.7 power law (i.e. approximately square root) of the signal level. This increase in gain will continue to occur until some other clipping mechanism occurs to limit the gain.

The first DC biasing circuit 50 is operated in such a way that the bias voltage applied to the gate of the MESFET 77 ensures operation in the region close to pinch off. In other words, the MESFET 77 is close to switched on condition. This region of operation of the MESFET 77 will be described hereinafter as the quasi switched on region. It should be noted that for other types of transistor, for example bipolar junction transistor, there are regions equivalent to the defined quasi switched on region and are known to a person skilled in the art. Although, in this embodiment, the quasi switched on region is a voltage controlled region, it should be appreciated that in alternative transistor arrangements the quasi switched on region may be a current controlled region.

The source of the MESFET 77 is connected to ground and the drain of the MESFET 77 is connected to a first terminal of a second Tee shaped connector 82. A second terminal of the second Tee shaped connector 82 is connected to the input of the feedback circuit 54. A third terminal of the second Tee shaped connector 82 is connected to output matching circuitry 58. The output matching circuitry 58 may be of conventional matching circuitry design and thus comprise an impedance which, if matched, will allow the maximum power to be transferred. The output matching circuitry 58 serves to reduce return loss and increase the bandwidth to frequency ratio of the lineariser. A low return loss allows the cascading of the lineariser. Additionally the output matching circuitry 58 may be used to force the lineariser to provide a maximised gain expansion.

The output of the output matching circuitry 58 is connected to a first terminal of a third Tee shaped connector 84. A second terminal of the third Tee shaped connector 84 is connected to a second DC biasing circuit 60. A third terminal of the third Tee shaped connector 84 is connected to a phase changing circuit 62 at a node A.

The second DC biasing circuit 60 supplies part of the DC biasing for a transistor arrangement 56 described. The biasing voltage provided by the second DC biasing circuit 60 is such that the transistor arrangement 56 operates with increased gain expansion.

The second DC biasing circuit 60 comprises a second DC voltage source 86 and a second bias decoupling capacitor 87. The second DC voltage source 86 has a first output connected to the second bias decoupling capacitor 87 and a second output connected to ground. The second DC voltage source 86 produces a DC voltage which can be varied between an upper and lower limit. The second bias decoupling capacitor 87 is connected between the first output of the second DC voltage source 86 and ground. The second bias decoupling capacitor 87 passes most time variant signals to ground. This means that the voltage presented to the output matching circuitry 58 is substantially DC.

The second DC biasing circuit 60 produces and controls the voltage between the drain and source of the MESFET 77. The DC voltage produced by the second DC biasing circuit 60 will be termed the drain-source voltage hereinafter.

The phase changing circuit 62 comprises firstly a series combination of a first phase inductor 88 and a first phase resistor 90. The series combination of the first phase inductor 88 and the first phase resistor 90 is in parallel with a series combination of a second phase inductor 89 and a second phase resistor 91, so forming a first parallel combination 93. The first terminal of the first parallel combination 93 is connected to the third terminal of the third Tee shaped connector 84 at node A. A second terminal of the first parallel combination 93 is connected in series with a third phase resistor 92. The third phase resistor 92 is also connected in series with a third phase inductor 94. The third phase inductor 94 is connected in series to a first terminal of a second parallel combination 97. The second parallel combination 97 comprises a phase DC voltage supply ($V_c$) connected in parallel with a varactor capacitor 98. The phase DC voltage supply $V_c$ and the varactor capacitor 98 are connected in parallel between the third phase inductor 94 and ground. The varactor capacitor 98 is arranged in such a way that the capacitance of the varactor capacitor 98 is related to the voltage supplied across it by the phase voltage supply $V_c$.

The phase changing circuit 62 is therefore composed of a combination of resistors, inductors and capacitors, which form a tuned circuit. The tuned circuit has a frequency characteristic which is dependent upon the values and arrangement of the composite inductors, resistors and capacitors. As the capacitance of the varactor capacitor 98 is dependent upon the voltage supplied across it by the phase voltage supply $V_c$, it is apparent that the frequency characteristic of the phase changing circuit 62 is also dependent upon the voltage supplied by the phase voltage supply $V_c$. By controlling the phase voltage supply $V_c$ and accordingly the frequency characteristic of the phase changing circuit 62, the phase of a signal at node A can be controlled. The signal prior to node A will have a phase substantially similar to that as determined by the EDGE modulator. The phase of this signal at node A will then be altered by the phase changing circuit 62, the degree by which the phase is altered is determined by the phase voltage source $V_c$. This phase alignment is preferably an independent function. The phase of the signal at node A is altered in such a way that when the signal is subsequently passed to the external amplifier means, the unwanted phase alterations produced by the external amplifier means can be compensated.

RF decoupling capacitor 83 may also be provided between the connector 84 and the node A for providing isolation between these two points. This enables the circuit 62 to operate with independent phase alignment. If the capacitor 83 is omitted, the voltage from the circuit 60 may disturb the operation of the circuit 62.

Additionally connected to node A is an output decoupling capacitor 64. The output decoupling capacitor 64 has its input connected to the third terminal of the third Tee shaped connector 84. The output of the output decoupling capacitor 64 is subsequently fed to amplifier means which are not shown. The output decoupling capacitor 64 substantially removes the DC component of the output signal so that only the time varying component of the signal to be amplified is fed to the external amplifier means. The second decoupling capacitor may be used for stopping any DC component from the external amplifier means from being passed to the lineariser.

The operation of the present invention will be described with reference to FIGS. 6–8b.

A signal produced by an external modulator which requires amplifying may be input to the arrangement of FIG. 5. The signal may comprise a DC component and a time varying component and may be an analogue or digital signal. The input signal is presented to the input decoupling capacitor means 48. The input decoupling capacitor means 48 substantially removes the DC component present in the input signal. The signal output from the input decoupling capacitor means 48 therefore substantially comprises a time varying signal.

Attached to the second terminal of the connector 68 is the first DC biasing circuit 50. The first DC biasing circuit 50 produces a substantially constant gate bias voltage. The gate biasing voltage is such that the MESFET 77 operates in the quasi switched on region as previously defined.

The drain of the MESFET 77 is connected to the second DC bias circuit 60. The second DC bias circuit 60 produces a substantially constant drain-source biasing voltage across the MESFET 77. The drain-source biasing voltage defines the power gain characteristics which the MESFET 77 exhibits. This is described in detail with reference to FIG. 6.

Figure 6:
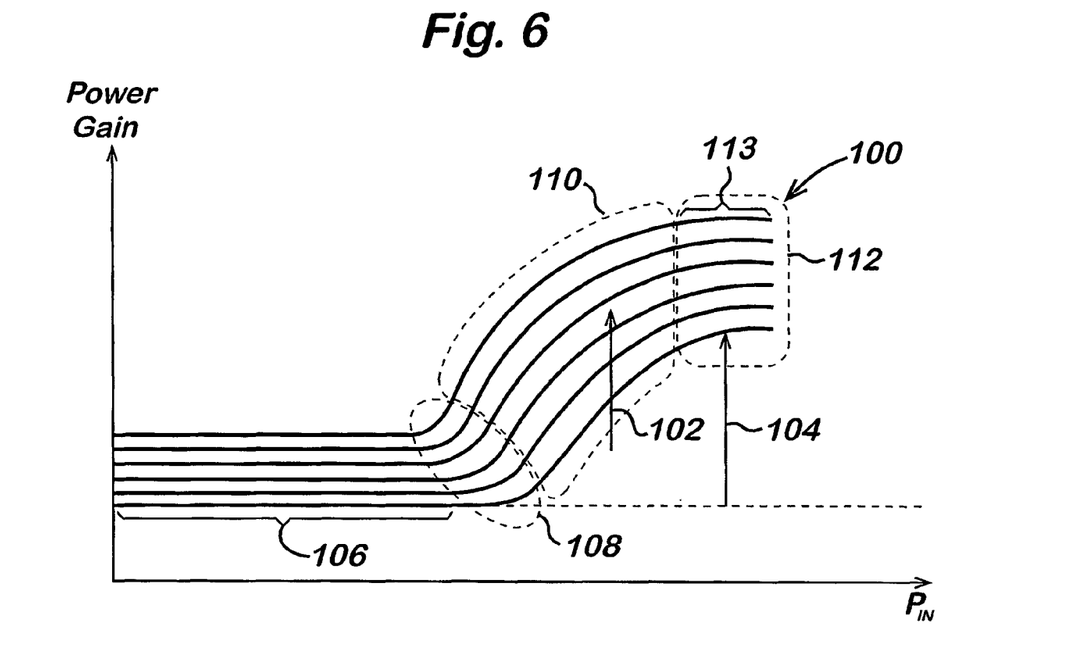
FIG. 6 shows a typical power gain characteristic diagram of the embodiment of FIG. 5.

FIG. 6 shows a family of curves of power gain against input signal power for the lineariser with an increasing drain-source voltage 102 across the MESFET 77. As the drain-source voltage across the MESFET 77 increases, a family of gain curves is produced 100. When the input signal power is within a region 106, the power gain of the lineariser is substantially constant. This means that whilst the input signal power is within the region 106, the output signal power is linearly related to the input signal power. The amount of amplification in this region is constant and is determined by the power gain. Whilst the input signal power is within the region 106, increasing the drain-source voltage 102 increases the constant power gain at which the lineariser operates.

As the input signal power increases into a region 108 the power gain of the lineariser is no longer substantially constant and begins to increase non linearly with increasing input signal power. The region 108 will be described hereinafter as the knee of the power gain characteristic. The point at which the knee of the power gain characteristic 108 occurs is dependent upon the drain-source voltage across the MESFET 77. As the drain-source voltage across the MESFET 77 increases 102, the input signal power which corresponds to the knee of the power gain characteristic 108 is reduced. As the input signal power exceeds the knee of the power gain characteristic, 108 the power gain of the lineariser continues to increase non linearly 110 with input signal power. As the input signal power continues to increase beyond the non linear region 110 and into a second constant region 112, the gain begins to become substantially constant 113. The point at which the second constant region 112 occurs is dependent upon the drain-source voltage across the MESFET 77. As the drain-source voltage across the MESFET 77 increases 102, the input signal power which corresponds to the second constant region 112 is reduced.

The second constant region 112 of substantially constant power gain defines the amount of gain expansion 104 produced by the lineariser. The gain expansion 104 more specifically is the amount of power gain increase between the first region of constant power gain 106 and the second region of constant power gain 112. To mitigate the known non-linearity problems of amplifiers as described hereinbefore, about 5 dB or more of gain expansion is required. In fact, in an embodiment of the present invention there may be provided in excess of 7 dB of gain expansion.

The power gain characteristics of a particular amplifier may be unique to that amplifier. This means that it may be advantageous to vary the power gain characteristics of the lineariser so as to mitigate the power gain non-linearity limitations associated with a particular amplifier to which the present invention may be attached.

The drain-source voltage across the MESFET 77 help defines the power gain of the first constant gain region 106, the knee region of the power gain characteristic 108 and the power gain of the second constant gain region 112. This means that by varying the drain-source voltage across the MESFET 77, the power gain characteristic of the lineariser can be varied across a range of input signal powers, to suit a particular amplifier. Variation of the drain-source voltage across the MESFET 77 is achieved by controlling the voltage produced by the second DC biasing circuit 60.

The substantially time varying input signal which is output from the decoupling capacitor means 48 is fed into the gate of the MESFET 77. The MESFET 77 operates with a power gain characteristic as shown in FIG. 6. The power gain characteristic is determined by the drain-source voltage across the MESFET 77, as previously described, and operates with characteristics appropriate to the particular amplifier to which the present invention may be attached.

The time varying signal output from the MESFET 77 will have an associated power level. This power level may or may not be similar to the power level of the signal input to the MESFET 77. The power level of the time varying signal output from the MESFET 77 will be compensated according to the power gain characteristics as shown in FIG. 6. The compensated time varying signal is fed from the output of the MESFET 77 into the first terminal of the second Tee shaped connector 82. A fraction of the compensated time varying signal is fed back via the feedback circuit 54 to the second terminal of the first Tee shaped connector 74. The feedback circuit takes some power out the line after the MESFET 77 and feeds it back before the MESFET 77 thereby slightly reducing the total gain but increasing the bandwidth and stabilising the operation of the circuitry.

The time compensated time varying signal is then passed, via the output matching circuit 58, to node A. Attached to node A is the phase changing circuit 62. The phase changing apparatus 62 compensates for the phase deviation i.e. aligns the node A. The deviation may be caused by an amplifier to which the FIG. 5 circuitry is be attached. The relative phase characteristics of the phase changing apparatus 62 are described in FIG. 7.

Figure 7:
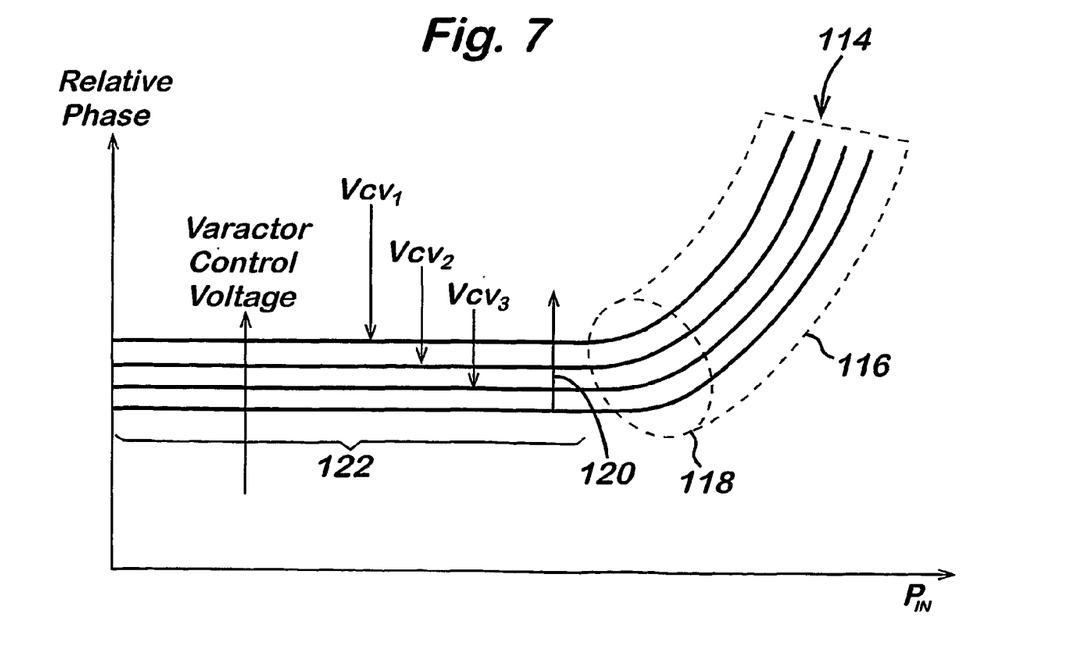
FIG. 7 shows a typical phase characteristic diagram of the embodiment of FIG. 5.

Referring now to FIG. 7, which shows a typical family of curves for the relative phase characteristic of an embodiment of the present invention against input signal power ($P_{in}$). The family of curves 114 being described for an increasing voltage 120 across the varactor capacitor 98. When the input signal power is located within the region 122, the relative phase of the lineariser is substantially constant. This means that the phase of the input signal to the lineariser is substantially the same as the phase of the signal output from the lineariser. Increase in the voltage across the varactor diode when the input power is within region 122 produces an increased relative phase as described in FIG. 7. The different curves illustrate the behaviour of different voltages.

As the input signal power increases into the region 118, the relative phase is no longer substantially constant and begins to increase non-linearly with increasing input signal power. The point at which region 118 occurs is dependent upon the voltage across the varactor capacitor 98. As the voltage across the varactor capacitor 98 increases 120, the input signal power that corresponds to the region 118 is reduced. As the input signal power continues to increase beyond the region 118 and into the region 116, the relative phase continues to increase non-linearly with input signal power up to a point of maximum relative phase (not shown).

Additionally attached to node A is the output decoupling capacitor 64. The compensated signal is passed to the externally attached amplifier (not shown) via the output decoupling capacitor 64. The compensated signal which is output to the decoupling capacitor 64 may comprise a DC component and a time varying component. This is because the first and second DC bias circuits 50 and 60 respectively, may add a DC component to the compensated signal. This DC component is not wanted by the externally attached amplifier and may therefore be removed by the output decoupling capacitor 64.

Figure 8A:
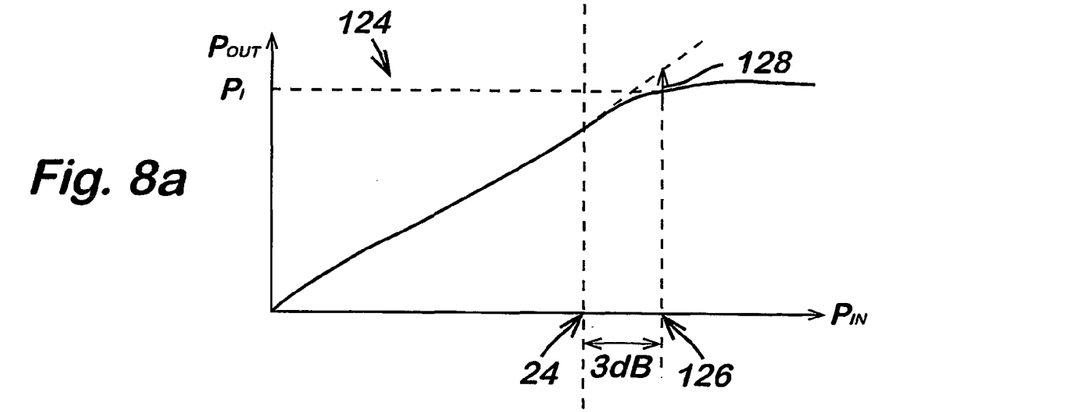
FIG. 8a shows the power characteristics of a combination of power amplifier and the lineariser of FIG. 5.

Reference is now made to FIG. 8a which shows a typical output power characteristic 124 of the combination of a typical power amplifier and an embodiment of the present invention. As discussed previously, a power amplifier has the highest efficiency at the P1 point 24. The efficiency is a characteristic of the power amplifier itself, in other words does not depend on the external circuitry which the amplifier may source or be sourced from.

It should be understood that the old P1 point 24 is defined hereinafter as the point of highest efficiency for a typical power amplifier and the new P1 point 126 is defined hereinafter as the point at which 1 dB of compression 128 occurs for the combination of a typical power amplifier and an embodiment of the present invention.

As is seen when compared to FIG. 3a, the new P1 point 126 is shifted by 3 dB so it occurs when there is 3 dB more input signal power than when compared to the old P1 point 24. This is advantageous because the point of highest efficiency for an amplifier is still the old P1 point 24 which is now on the linear part of the output power characteristic. The amplifier may now be operated in the linear region of the power amplifier. Operating the amplifier in the linear region reduces intermodulation distortion. Additionally, operating the amplifier at the point of most efficiency reduces the heat dissipated by the amplifier. Furthermore, a further 3 dB of input signal power may be presented to the input of the power amplifier before saturation is reached meaning that an oversized amplifier is no longer required.

Figure 8B:
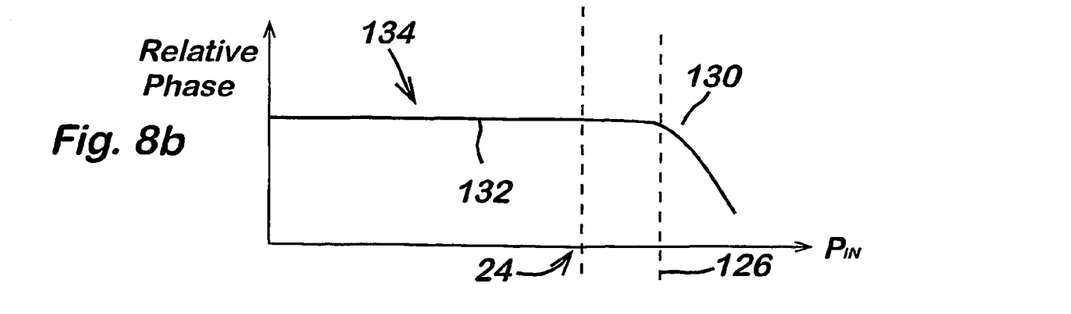
FIG. 8b shows the phase characteristics of a combination of power amplifier and the lineariser of FIG. 5.

FIG. 8b shows a typical relative phase characteristic of the series combination of a power amplifier and an embodiment of the present invention. As discussed previously, the relative phase characteristic 130 of a power amplifier is not constant at the P1 point. This means the phase of the input signal is not the same as the output signal for a power amplifier operating at the P1 point. The relative phase characteristic is a characteristic of the power amplifier itself, in other words does not depend on the external circuitry which the power amplifier may source or be sourced from. As is seen when compared to FIG. 3a, the new P1 point 126 is shifted by 3 dB so it occurs when there is 3 dB more input signal power than when compared to the old P1 point 24. This is advantageous because the relative phase characteristic of the power amplifier is now constant 132 at the old P1 point 24. As mentioned previously, the old P1 point 24 is the point around which the amplifier would be operated for high efficiency. This means that the relative phase characteristic 134 of the power amplifier is substantially constant around the point of operation of the amplifier and so mitigating the phase problems as described hereinbefore.

Figure 9:
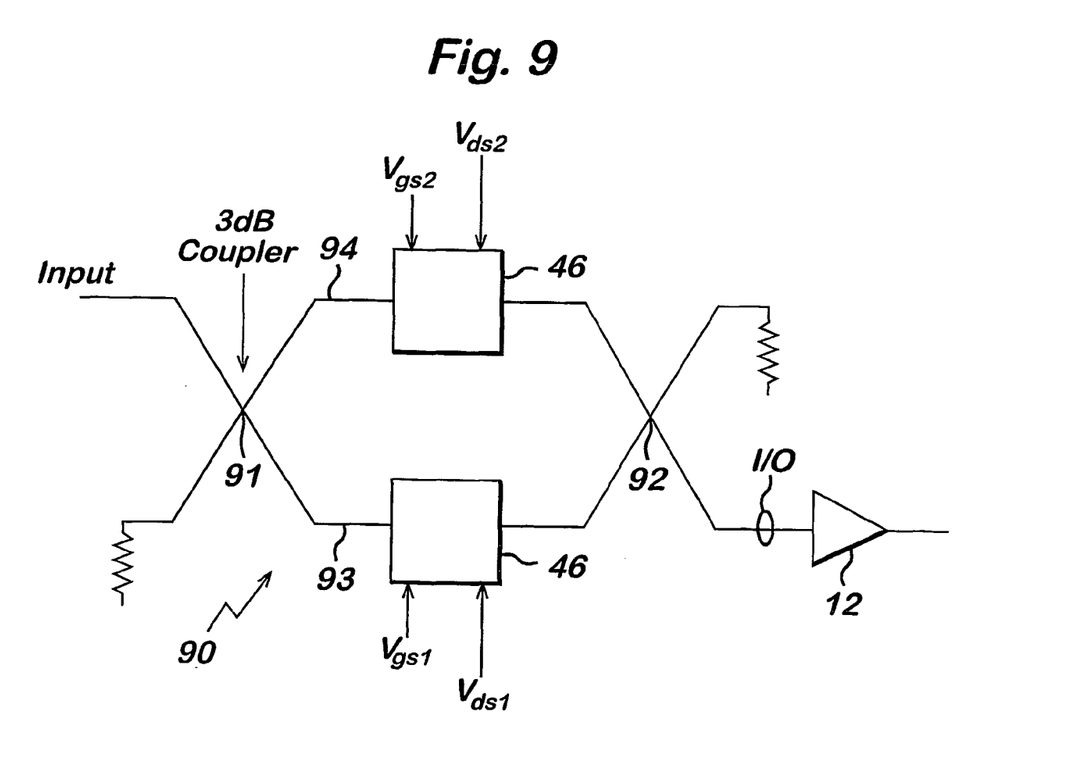
FIG. 9 shows a further embodiment of the present invention.

Although the present invention has been described in relation to a single lineariser used in conjunction with a single amplifier, it should be appreciated that any number or combination of amplifiers and linearisers may be used. An example of an arrangement comprising a plurality of linearisers is shown in FIG. 9. More particularly, FIG. 9 shows a balanced lineariser arrangement 90 for an amplifier comprising two lineariser blocks 46. The lineariser blocks 46 are arranged to operate in accordance with the above described principles. The lineariser arrangement 90 is coupled prior a RF power amplifier 12. The lineariser arrangement 12 is balanced by means of coupling provided by two couplers 91 and 92. The two linearisers on paths 93 and 94 are cross-coupled in the manner illustrated by FIG. 9. However, it should be appreciated that this is only a preferred example of the possible multi-lineariser arrangements, and that other arrangements are also possible.

Whilst the embodiment of the present invention has been described in the context of a GSM system using EDGE modulation, it should be appreciated that embodiments of the present invention can be used in any other digital system or analogue system. Embodiments of the invention can be used in wired or wireless communication systems. Embodiments of the present invention can also be used outside the field of communication wherever a lineariser for a radio frequency (RF) signal amplifier is used.

Embodiments of the present invention can be used in systems which use frequency division multiple access (FDMA), time division multiple access (TDMA) or hybrids of any of the aforementioned systems. Therefore, in addition to the above described context of a GSM system using EDGE modulation. It should be appreciated however that embodiments of the present invention can be used with any other system where a modulated signal may be used in conjunction with amplifier means. These systems include, without limiting to these, cellular standards such various GSM based systems (such as GPRS: General Packet Radio Service) or CDMA or WCDMA (Code Division Multiple Access or Wideband CDMA) based 3$^{rd}$ generation telecommunication systems such as the Universal Mobile Telecommunication System (UMTS), i-Phone, IS-95 and IMT 2000 (International Mobile Telecommunication System 2000) and so on.

The described embodiment is described using a transistor arrangement comprising a MESFET transistor. It should be noted that embodiments of the present invention may be used with metal oxide field effect transistors (MOSFETS), bipolar junction transistors (BJTs) For example, hetero bipolar transistors (HBT), high electron mobility transistors (HEMT) or LD Metal Oxide Semiconductors (LDMOS) or any other form or type of transistor device.

The invention claimed is:

1. A lineariser arranged to provide an increase in gain for an increased signal power level comprising:
    input matching means arranged to receive an input signal;
    a transistor arranged to operate substantially close to a switched on condition, said transistor being arranged to apply a non-linear gain to said input signal;
    outputting the non-linear gain signal;
    feedback means provided across said transistor comprising resistive circuitry; and
    phase changing circuitry, including a varactor, compensating for changes in said input signal as it passes from said input to said output.

2. A lineariser as claimed in claim 1, wherein said transistor is arranged to be operated in a voltage or current controlled region.

3. A lineariser as claimed in claim 1, wherein biasing means are provided for biasing said transistor.

4. A lineariser as claimed in claim 3, wherein said biasing means is arranged to control the power gain characteristics of said transistor.

5. A lineariser as claimed in claim 1, wherein said input matching means arranged to remove a DC component of said input signal.

6. A lineariser as claimed in claim 1, wherein said input matching means are arranged to reduce or prevent the input signal being reflected back to the input.

7. A lineariser as claimed in claim 1, wherein said output means comprises an output matching circuit.

8. A lineariser as claimed in claim 1, wherein said transistor is a MESFET.

9. A lineariser as claimed in claim 8, wherein said MESFET operates in a quasi switched on region.

10. A lineariser as claimed in claim 1, wherein said transistor is one of the following list: a metal oxide field effect transistor (MOSFET); a bipolar junction transistor (BJT); a hetero bipolar transistor (HBT); a high electron mobility transistor (HEMT); a LD Metal Oxide Semiconductor (LDMOS).

11. A lineariser as claimed in claim 1, wherein said field effect transistor is arranged to be operated close to the pinch-off region.

12. A lineariser as claimed in claim 1, wherein the output matching circuitry serves to reduce return loss and increase the bandwidth to frequency ratio of said lineariser.

13. A lineariser as claimed in claim 1, wherein the input matching circuitry serves to reduce return loss and increase the bandwidth to frequency ratio of said lineariser.

14. A lineariser arranged to provide an increase in gain for an increased signal power level comprising:
    input matching means arranged to receive an input signal;
    a transistor arranged to operate substantially close to a switched on condition, said transistor being arranged to apply a non-linear gain to said input signal;
    outputting the non-linear gain signal;
    feedback means provided across said transistor comprising resistive circuitry; and,
    phase changing circuitry, including a varactor, compensating for changes in said signal as it passes from said input to said output, wherein said varactor is controlled by tuned circuitry.

15. A lineariser arranged to provide an increase in gain for an increased signal power level comprising:
    input matching means arranged to receive an input signal;
    a transistor arranged to operate substantially close to a switched on condition, said transistor being arranged to apply a non-linear gain to said input signal; and
    outputting the non-linear gain signal;
    feedback means provided across said transistor comprising resistive circuitry; and
    phase changing circuitry, including a varactor, compensating for changes in said signal as it passes from said input to said output, wherein the varactor is controlled by an external voltage.

16. A lineariser as claimed in claim 1, wherein said input signal is a radio frequency signal.

17. A lineariser as claimed in claim 16, wherein said radio frequency signal is a signal to be transmitted in a cellular communication system.

18. A lineariser as claimed in claim 1, wherein said input signal is a modulated signal.

19. A lineariser as claimed in claim 18, wherein said input signal is an EDGE modulated signal.

20. A lineariser as claimed in claim 1, in combination with an amplifier.

21. A mobile station comprising a lineariser arranged to provide an increase in gain for an increased signal power level, the lineariser comprising:
    input matching means arranged to receive an input signal;
    a transistor arranged to operate substantially close to a switched on condition, said transistor being ranged to apply a non-linear gain to said input signal;
    outputting the non-linear gain signal;
    feedback means provided across said transistor comprising resistive circuitry; and
    phase changing circuitry, including a varactor, compensating for changes in said signal as it passes from said input to said output.

22. A base station comprising a lineariser arranged to provide an increase in gain for an increased signal power level, the lineariser comprising:
    input matching means arranged to receive an input signal;
    a transistor arranged to operate substantially close to a switched on condition, said transistor being arranged to apply a non-linear gain to said input signal;
    outputting the non-linear gain signal;
    feedback means provided across said transistor comprising resistive circuitry; and
    phase changing circuitry, including a varactor, for compensating for changes in said signal as it passes from said input to said output.

* * * * *